United States Patent [19]
Freerks et al.

[11] Patent Number: 5,220,515
[45] Date of Patent: Jun. 15, 1993

[54] FLOW VERIFICATION FOR PROCESS GAS IN A WAFER PROCESSING SYSTEM APPARATUS AND METHOD

[75] Inventors: Fred W. Freerks, Cupertino; Richard C. Muh, Fremont, both of Calif.

[73] Assignee: Applied Materials, Inc., Santa Clara, Calif.

[21] Appl. No.: 688,214

[22] Filed: Apr. 22, 1991

[51] Int. Cl.$^5$ .............................................. G06F 15/46
[52] U.S. Cl. ..................................... 364/510; 364/558; 73/223
[58] Field of Search ............... 364/500, 509, 510, 550, 364/551.01, 558; 437/225; 73/23.2, 223, 861.42; 118/729

[56] References Cited

U.S. PATENT DOCUMENTS

| | | | |
|---|---|---|---|
| 4,364,413 | 12/1982 | Bersin et al. | 364/510 |
| 4,801,352 | 1/1989 | Piwczyk | 118/729 |
| 4,949,669 | 8/1990 | Ishii et al. | 118/729 |
| 4,989,160 | 1/1991 | Garrett et al. | 364/509 |

Primary Examiner—Parshotam S. Lall
Assistant Examiner—Michael Zanelli
Attorney, Agent, or Firm—Paul Hentzel

[57] ABSTRACT

The flow of process gas used in a semiconductor wafer fabrication system is verified against the known flow of a verification gas using a derivative of the ideal gas law:

$$n'_{pro} = (P'_{pro}/P'_{ver}) n'_{ver}$$

where
  $n'_{pro}$ is the flow rate of the process gas,
  $n'_{ver}$ is the flow rate of the verification gas,
  $P'_{pro}$ is the rate of change with respect to time of the process gas pressure entering the chamber, and
  $P'_{ver}$ is the rate of change with respect to time of the verification gas pressure entering the chamber.

The volume and temperature are maintained constant during the verification procedure.

30 Claims, 3 Drawing Sheets

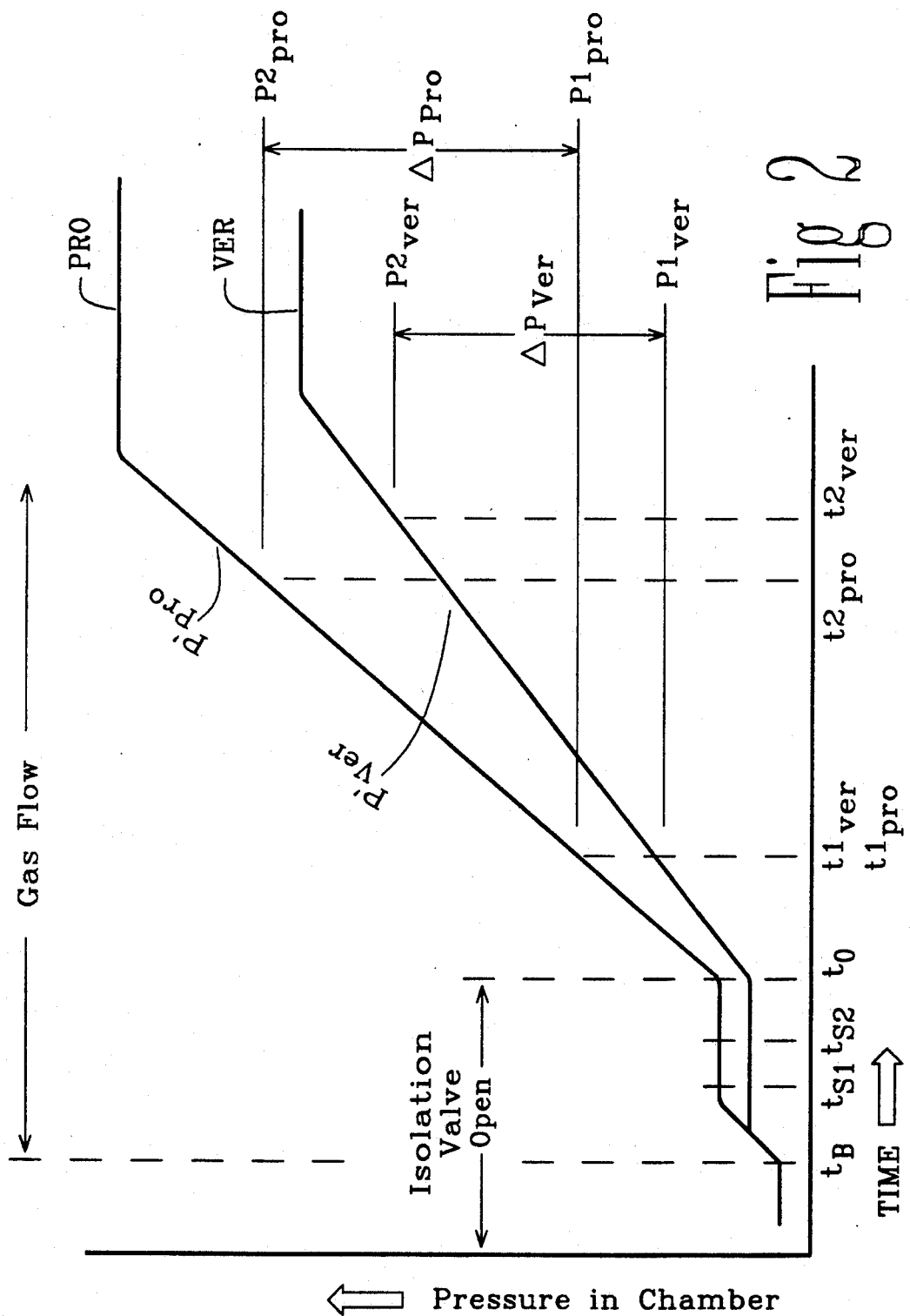

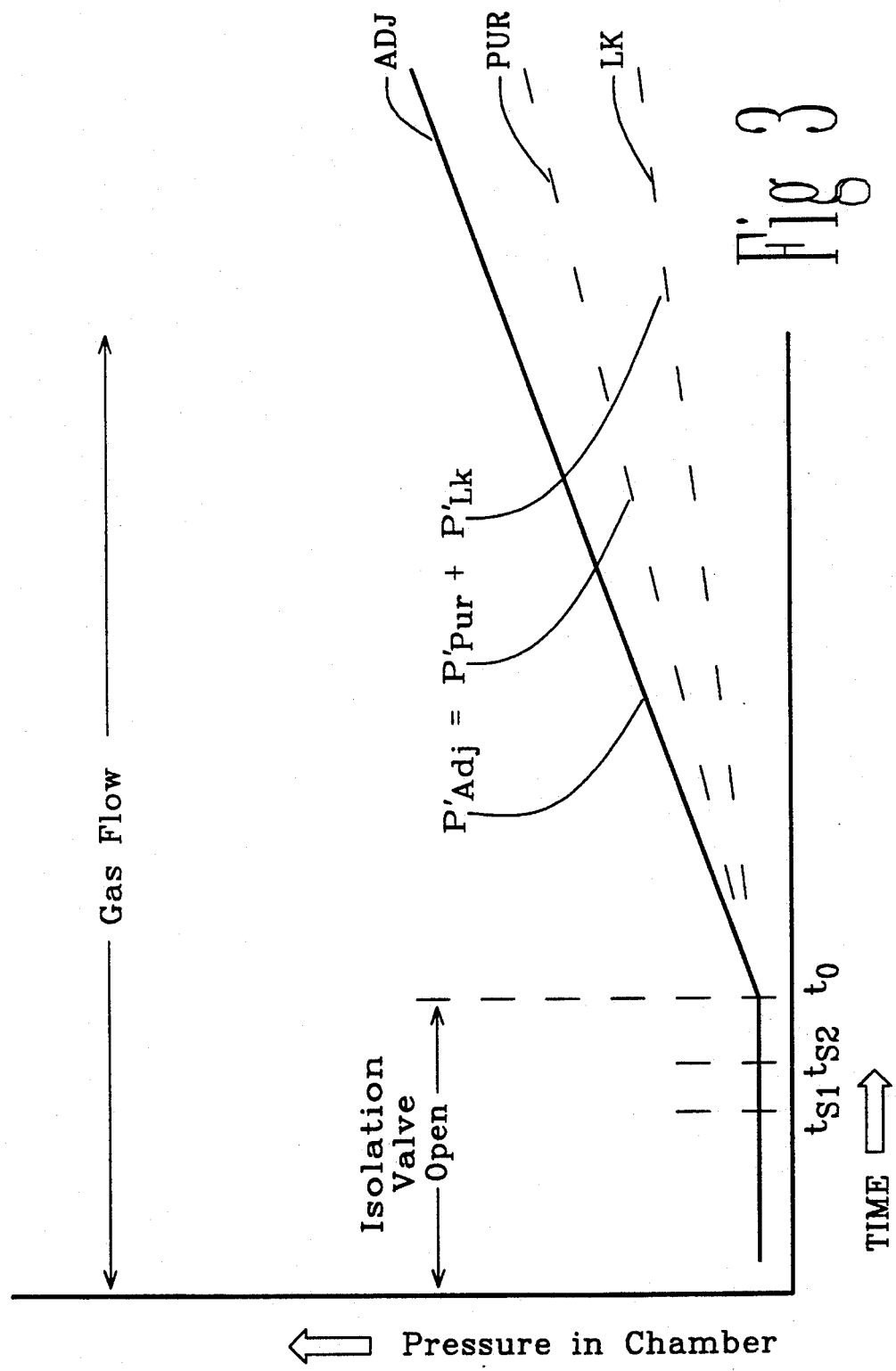

FLOW VERIFICATION FOR PROCESS GAS IN A WAFER PROCESSING SYSTEM APPARATUS AND METHOD

TECHNICAL FIELD

This invention relates to verifying the flow rate of a process gas into the reaction chamber of a wafer processing system; and more particularly verifying by comparison with the known flow rate of a verification gas.

BACKGROUND

During wafer fabrication, the deposition formation rate and etching removal rate depend on the input flow rate and the chamber pressure of the process gases. Changes in input flows create changes in chamber pressure; but, these changes do not directly correlate with changes in the deposited layer in a deposition system or to material removal in an etch system during a given exposure time.

Heretofore, the determination of the process gas input flow rate was based on a best measurement of the ambient temperature of the reaction chamber, and a best estimate of the volume of the chamber at that ambient temperature. The measured temperature required an absolute baseline temperature determined through calibrated instruments. This baseline temperature was only as accurate as the instrument quality and condition, and the effectiveness of the calibration technique. Further, raising the reaction chamber to the operating temperature introduced a basic transition error.

SUMMARY

It is therefore an object of this invention to provide an improved method and apparatus for verification of the flow rate of the process gas.

It is another object of this invention to verify the flow rate of the process gas independently of the operating temperature of the reaction chamber.

It is a further object of this invention to verify the flow rate of the process gas independently of the volume of the reaction chamber.

It is a further object of this invention to verify the flow rate of the process gas independently of the absolute pressure in the reaction chamber.

It is a further object of this invention to verify the flow rate of the process gas relative to a known flow rate of a verification gas.

It is a further object of this invention to verify the flow rate of the process gas by simple procedures executed at the operating temperature of the chamber between wafer fabrication processes.

It is a further object of this invention to verify the flow rate of the process gas while providing for system leakage compensation.

It is a further object of this invention to verify the flow rate of the process gas while providing for purge flow compensation.

Briefly, these and other objects of the present invention are accomplished by providing a method of verifying the flow rate of a process gas entering the reaction chamber of a wafer processing system by comparison with the known flow rate of a verification gas. A flow of verification gas is provided into the chamber having a known flow rate. A first pressure of the verification gas within the chamber is measured at a first verification time. A second pressure of the verification gas within the chamber is measured at a second verification time. A flow of process gas is provided into the chamber having a flow rate to be verified. A first pressure of the process gas within the chamber is measured at a first process time. A second pressure of the process gas within the chamber is measured at a second process time. The rate of change of the verification gas pressure with respect to time is determined. The rate of change of the process gas pressure with respect to time is determined. The flow rate of the process gas into the chamber is determined based on the flow rate of the verification gas and the rate of change of the pressures.

BRIEF DESCRIPTION OF THE DRAWING

Further objects and advantages of the present verification apparatus and the operation of the verification procedure will become apparent from the following detailed description and drawing in which:

FIG. 2 is a chart of chamber pressure verses time showing the change of pressure for the verification sequence (curve VER), and the change of pressure for the process sequence (curve PRO); and FIG. 3 is a chart of chamber pressure verses time showing the change of pressure for the related gas adjustment sequence (curve ADJ).

Figure 1:
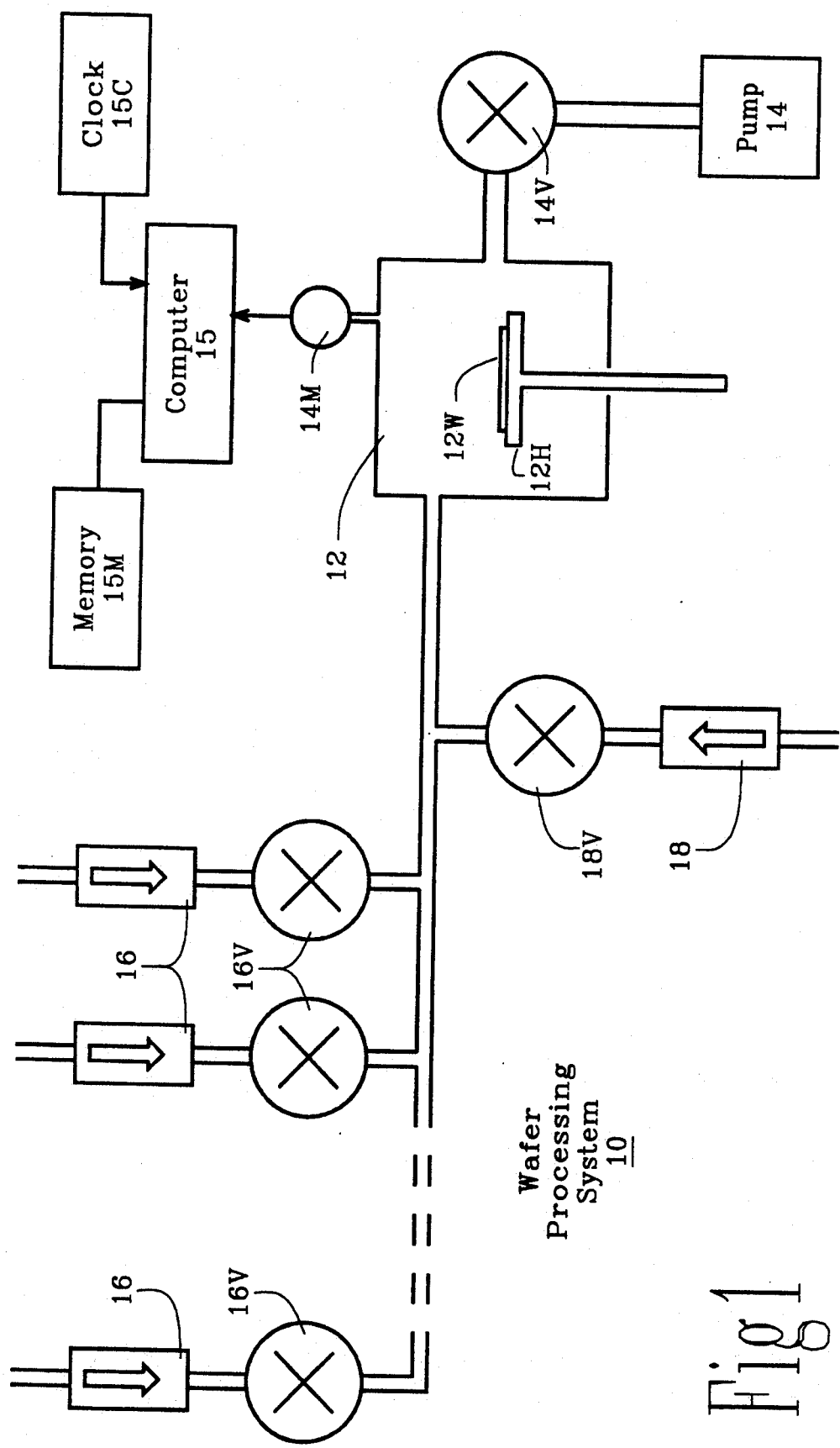
FIG. 1 is a schematic diagram of a wafer processing system showing the verification apparatus.

The elements of the invention are designated by two digit reference numerals. The first digit indicates the Figure in which that element is first disclosed or is primarily described. The second digit indicates like features and structures throughout the Figures. Some reference numerals are followed by a letter which indicates a sub-portion or feature of that element.

GENERAL EMBODIMENT

FIG. 1

Semiconductor wafer processing system 10 includes a reaction chamber 12 for containing wafer 12W being processed, pump 14 for reducing the pressure within the chamber during processing, and a plurality of process flow controllers 16 for providing a constant flow of the process reaction gases into the chamber. The rate of flow of the process gas is periodically verified by comparison to a verification flowing at a known rate "$n'_{ver}$" through verification flow controller 18 which is a standard source. The known flow rate $n'_{ver}$ (standard flow rate) permits calculation of a chamber operating coefficient $K_c$ for any operating temperature and volume of the chamber (see Ideal Gas Law section). Once $K_c$ has been determined for specific operating conditions, the flow rate "$n'_{pro}$" of the process gas may be determined.

The verification procedure requires two sequences. First, a verification gas sequence for determining $K_c$ based on the rate of pressure change of the verification gas "$P'_{ver}$" as the verification gas flows into the evacuated chamber. The chamber pressure is measured by pressure monitor 14M at predetermined time intervals (see FIG. 2) for determining the slope of the pressure change. Second, a process gas sequence for determining $n'_{pro}$ based on $K_c$ and the rate of pressure change of the process gas "$P'_{pro}$".

The flow controllers may be any suitable regulation device for maintaining a constant flow of gas into the evacuated chamber, such as a thermo gas mass flow controller described in the publication "Mass Flow Controllers" (May 1987) prepared by Unit Instruments, Inc , 1247 West Grove Avenue, Orange, Calif. 92665.

Such mass flow controllers maintain a constant flow of mass therethrough over an operating range of upstream pressure and down stream pressure. During the gas sequences, a fixed number of molecules flow into the chamber per unit time.

A process gas valve 16V is positioned in each of the plurality of process gas source lines between the process flow controller 16 and the reaction chamber for starting and stopping the flow of process gas. Valve 16V for the selected process gas establishes fluid communication with the chamber when opened during the process gas sequence. Similarly, verification gas valve 18V is positioned in the verification gas source line between verification flow controller 18 and the reaction chamber for establishing fluid communication when opened during the verification gas sequence.

Pressure monitor 14M may be any suitable pressure measuring device such as a capacitance manometer described in the publication "MKS Baratron, Capacitance Manometers" (November 1987) prepared by MKS Instruments, Inc, Six Shattuck Road, Andover, Me. 01810. The MKS devices employ a prestressed metal strain gauge diaphragm.

Computer 15 is a suitable calculator device such as a computer, which is responsive to the pressure measurements from the pressure monitor for determining $K_c$ and the process gas flow rate $n'_{pro}$. Memory 15M for computer 15 receives the rate of pressure changes, coefficients, flow rates, and other calculations generated by the computer. Clock 15C for computer 15 provides the time base for establishing the time periods involved in the verification procedure and measures the elapsed time interval for calculation of the pressure rate of change.

IDEAL GAS LAW

The ideal gas law employed for calculating the conditional operating coefficient $K_c$ of the chamber and the process gas flow rate $n'_{pro}$ is based on Boyle's law of gases. The law concerns the compressibility of a fixed quantity of gas within a closed system, and is generally stated:

$$PV = n(R_u T) \quad \text{(Eq-1)}$$

where
- p = pressure of gas within the closed system,
- V = volume of the closed system,
- n = quantity of the gas in moles,
- T = temperature of gas within the closed system, and
- $R_u$ = universal gas constant.

The ideal gas law is particularly applicable to the low pressure, high temperature operating conditions found in typical wafer fabrication recipes. The low density and high velocity of the molecules of the gas within the chamber support a long mean free path between collisions.

For the verification gas sequence (determining $K_c$) the ideal gas law is more conveniently stated as:

$$K_c = R_u T/V = P_{ver}/n_{ver} \quad \text{(Eq-2)}$$

where
- $K_c$ = a conditional operating coefficient of the chamber, a characteristic of each reaction chamber conditional for a particular volume and operating temperature,
- $P_{ver}$ = the pressure of the verification gas in the chamber and
- $n_{ver}$ = quantity of verification gas.

The chamber condition (temperature and volume) remain constant throughout the two gas sequences, and the coefficient $K_c$ determined during the verification gas sequence is valid for the process gas sequence. The temperature is held constant by regulated heating provided to the chamber and the chamber components. The volume is defined by the rigid side walls of the chamber and the "fixture" items that normally occupy the chamber during both gas sequences such as wafer holder 12H. Preferably, the wafer is not present in the reaction chamber during either gas sequence of the flow verification procedure.

Taking the differential with respect to time for both the gas pressure $P_{ver}$ and the gas quantity $n_{ver}$ (in Eq-1) yields:

$$K_c = (dP_{ver}/dt_{ver})/(dn_{ver}/dt_{ver}) \quad \text{(Eq-3)}$$
$$= P'_{ver}/n'_{ver}$$

The coefficient $K_c$ may therefore be calculated based on the flow rate $n'_{ver}$ of the verification gas (which is known), and the first derivative $P'_{ver}$ of the verification gas pressure (which can be accurately determined—see operation sections).

For the process gas sequence (determining $n'_{pro}$), the ideal gas law is more conveniently stated as:

$$n_{pro} = P_{pro}/(R_u T/V) = P_{pro}/K_c \quad \text{(Eq-4)}$$

where
- $n_{pro}$ = quantity of process gas,
- $P_{pro}$ = the pressure of the process gas in the chamber, and
- $K_c$ = the conditional operating coefficient of the chamber as defined during the verification gas sequence.

Taking the differential with respect to time for both the gas pressure $P_{pro}$ and the gas quantity $n_{pro}$, yields the flow rate of the process gas:

$$n'_{pro} = P'_{pro}/K_c \quad \text{(Eq-5)}$$

or expressed in terms of the known verification gas flow rate $$n'_{pro} = (P'_{pro}/P'_{ver})(n'_{ver}) \quad \text{(Eq-6)}$$

The flow $n'_{pro}$ may therefore be calculated based on the flow rate $n'_{ver}$ of the verification gas (which is known), and by the first derivative $P'_{ver}$ and $P'_{pro}$ of the gases (which can be determined—see operation sections).

OPERATION OF THE VERIFICATION GAS SEQUENCE

FIG. 2

The determination of the conditional operating coefficient $K_c$ of the chamber is based on the known flow rate of the verification gas and the ideal gas law. FIG. 2 shows the chamber pressure response verses time (curve VER) for the verification gas pressure during the verification sequence.

Prior to the beginning of the procedure (at time=tB), isolation valve 14V between the chamber and the pump is open. Also prior to time tB, all process gas valves 16V and verification gas valve 18V are closed, and no verification gas or process gas is flowing. By time tB, the chamber has been evacuated to a reduced baseline chamber pressure. At time tB the verification gas valve is opened and the verification gas flows into the chamber. The throttling transients are permitted to subside during a stabilization period (tB to tS1 as determined by clock 15C), and the verification gas flow stabilizes to chamber pressure P0. Computer 15 receives pressure measurements from pressure monitor 14M during a stabilization check period (tS1 to tS2) to determine that the gas flow has stabilized.

At time equal zero (time=t0) the isolation valve is closed and the chamber pressure increases due to the input flow of verification gas $n'_{ver}$. During valving period (t0 and $t1_{ver}$), the transients associated with closing the isolation valve subside. At first verification time ($t1_{ver}$), the pressure monitor provides a first verification pressure ($P1_{ver}$) to computer 15. At a subsequent second verification time ($t2_{ver}$), the pressure monitor provides a second verification pressure ($P2_{ver}$) to computer 15.

The computer calculates the rate of change of pressure ($P'_{ver}$) by dividing the change in pressure by the elapsed time interval:

$$i \; P'_{ver} = (P2_{ver} - P1_{ver}) / (t2_{ver} - t1_{ver}). \quad \text{(Eq-7)}$$

The rate of change of verification gas pressure $P'_{ver}$ is graphically illustrated by the slope of the pressure response curve VER of FIG. 2 between $t2_{ver}$ and $t1_{ver}$. The slope $P'_{ver}$ is recorded in memory 15M. The two measurement times are preferably selected so that the two pressure readings occur in the middle portion of the operating range of the monitor. The middle portion tends to be more linear than the lower and upper ends of the range, and therefore give a more accurate pressure reading.

The conditional operating coefficient of the chamber is calculated based on the ideal gas law:

$$K_c = P'_{ver} / n'_{ver} \quad \text{(Eq-8)}$$

and is independent of the absolute pressure of the gas within the reaction chamber. The effect of the constant chamber temperature and the constant chamber volume are included in the conditional operating coefficient. The same chamber coefficient is valid for both the verification gas sequence and the process gas sequence.

The gas employed as the verification gas is preferably a suitable inert, non-toxic, dry, readily available gas such as nitrogen gas ($N_2$), oxygen gas ($O_2$), nitrous oxide gas ($N_2O$) or argon gas (Ar), of appropriate chemical purity such as semiconductor fabrication grade.

OPERATION OF THE PROCESS GAS SEQUENCE

FIG. 2

The process gas sequence is similar to the verification gas sequence, except that prior to time=tB the selected process valve 16V is in the open position and verification valve 18V is closed. Process gas is flowing instead of verification gas. The rate of change of process gas pressure $P'_{pro}$ is determined following the same two point procedure show in FIG. 2. The computer provides the rate of change of the pressure ($P'_{pro}$) by dividing the change in pressure by the elapsed time interval:

$$P'_{pro} = (P2_{pro} - P1_{pro}) / (t2_{pro} - t1_{pro}) \quad \text{(Eq-9)}$$

for substitution in Eq-6 to calculate the process gas flow rate $n'_{pro}$.

The rate of change of process gas pressure $P'_{pro}$ is graphically illustrated by the slope of the pressure response curve PRO of FIG. 2 between $t2_{pro}$ and $t1_{pro}$. The slope $P'_{pro}$ is recorded in memory 15M. In the embodiment shown in FIG. 2, the process gas slope $P'_{pro}$ is slightly greater than the verification gas slope $P'_{ver}$, indicating that the process gas flow ($n'_{pro}$) is slightly greater than the verification gas flow ($n'_{ver}$). The two process gas pressures are also preferably selected from the middle more linear portion of the operating range of the monitor.

ADJUSTMENTS TO FLOW

FIG. 3

A basic assumption inherent in the above discussion of the two gas sequences is that no other gases are flowing into the chamber except the verification gas or the process gas. Any unaccounted gas flowing during the verification gas sequence which is not a verification gas will increase $P'_{ver}$ resulting in a higher $K_c$. Similarly, non process gases flowing during the process gas sequence will introduce an error in $P'_{pro}$. Related gas flows which are not part of the verification procedure, but which occur during both the verification gas sequence and the process gas sequence may be subtracted from the gas law derived equations.

A major related gas flow is $N_2$ purge gas flowing into the chamber from a turbo molecular pump used primarily in etch processes requiring particularly low chamber pressures. The turbo pump motor operates at a very high speed (about 27,000 rpm) and must be protected from the corrosive effects of the etch gas. The inward flow of the purge gas ($n'_{pur}$) prevents exposure of the pump bearings to the etch gas. Another source of related gas flow is leakage flow ($n'_{1k}$) into the chamber through seals and valves due to the reduced chamber pressure.

The first derivative of pressure in the chamber coefficient relationship (Eq-3) may be adjusted to correct for this related flow by subtracting out the first pressure derivatives of each of the related pressures:

$$K_{adj} = [P'_{ver} - (P'_{pur} + P'_{1k})] / (n'_{ver}) \quad \text{(Eq-10)}$$

or $$K_{adj} = (P'_{ver} - P'_{adj}) / (n'_{ver}) \quad \text{(Eq-11)}$$

where $P'_{pur}$ = any intentional flow such a purge flow across bearing surfaces, $P'_{1k}$ = any incidental flow such as leakage flow into the low pressure region of the system, and $P'_{adj}$ = the total flow into the chamber during the verification procedure which is neither verification gas nor process gas.

The adjusted conditional chamber coefficient is conditioned on the particular purge and leakage flows present at the time of the verification gas sequence. The first pressure derivatives of the related flows may be collectively determined by a separate related gas sequence shown in FIG. 3 which is similar to the verification sequence.

During the related gas sequence, both the verification gas valve 18V and the process gas valve 16V are closed. The only gas entering the chamber is the related gas under correction. The pressure slope $P'_{adj}$ between $t1_{adj}$ and $t2_{adj}$ represents the collective effect of the purge gas flow and the leakage flow. The purge component of the related gas is shown by slope $P'_{pur}$ (along curve PUR in dashed lines), and the leakage component is shown by slope $P'_{lk}$ (along curve LK also in dashed lines). The leakage component is typically much less then the purge component.

The first derivative of pressure in the process gas relationship (Eq-6) may be adjusted to correct for this related flow by subtracting out the first pressure derivatives of each of the related pressures:

$$n'_{pro} = [P'_{pro} - (P'_{pur} + P'_{lk})] / K_{adj}. \quad \text{(Eq-12)}$$

Substituting for $K_{adj}$ (Eq-10):

$$n'_{pro} = \frac{[P'_{pro} - (P'_{pur} + P'_{lk})](n'_{ver})}{[P'_{ver} - (P'_{pur} + P'_{lk})]} \quad \text{(Eq-13)}$$

which may be stated more generally as:

$$n'_{pro} = \frac{(P'_{pro} - P'_{adj})(n'_{ver})}{(P'_{ver} - P'_{adj})} \quad \text{(Eq-14)}$$

Thus the process gas flow rate can be adjusted for related as flows based on rates of change of pressure. It is not necessary to know the actual purge flow or leakage flow for the verification procedure.

CONCLUSION

It will be apparent to those skilled in the art that the objects of this invention have been achieved as described hereinbefore. Clearly various changes may be made in the structure and embodiments shown herein without departing from the concept of the invention. Further, features of the embodiments shown in the various Figures may be employed with the embodiments of the other Figures.

Therefore, the scope of the invention is to be determined by the terminology of the following claims and the legal equivalents thereof.

We claim as our invention:

1. A semiconductor wafer processing system with process gas flow verification, comprising:
   reaction chamber for containing the wafers during the processing;
   process gas source in fluid communication with the chamber for providing process gas required for the wafer processing;
   process gas flow controller means between the process gas source and the chamber for maintaining a constant flow of process gas during the wafer processing and the gas flow verification;
   verification gas source in fluid communication with the chamber for providing the verification gas required for verifying the constant flow of the process gas;
   verification gas flow controller means between the verification gas source and the chamber for maintaining a predetermined and constant flow of the verification gas;
   pump means for evacuating the chamber to a reduced gas pressure as required during the wafer processing and flow verification;
   pressure monitor for measuring the reduced gas pressure within the chamber during the wafer processing and the flow verification; and
   computer means responsive to the pressure monitor and to the flow of the verification gas for computing the flow of the process gas relative to the flow of the verification gas.

2. The processing system of claim 1 wherein the computer means computes the process gas flow in accordance with the following relationship derived from the law of gases:

$$n'_{pro} = (P'_{pro}/P'_{ver}) \, n'_{ver}$$

where
   $n'_{pro}$ is the flow rate of the process gas,
   $n'_{ver}$ if the flow rate of the verification gas,
   $P'_{pro}$ is the rate of change with respect to time of the process gas pressure entering the chamber, and
   $P'_{ver}$ is the rate of change with respect to time of the verification gas pressure entering the chamber.

3. The processing system of claim 2 wherein the flow of the verification gas is predetermined known value.

4. The processing system of claim 2 wherein the computer means further comprises a memory means for receiving and storing the gas flow rates $n'_{pro}$ and $n'_{ver}$ and rates of pressure change $P'_{pro}$ and $P'_{ver}$.

5. The processing system of claim 4 wherein the computer means further comprises a clock means for providing the time base for determining the gas flow rates $n'_{pro}$ and rates of pressure change $P'_{pro}$ and $P'_{ver}$.

6. The processing system of claim 5 wherein the computer means calculates the rate of pressure change for storage in the memory means, in accordance with the relationships:

$$P'_{ver} = (P2_{ver} - P1_{ver}) / (t2_{ver} - t1_{ver})$$

where
   $P2_{ver}$ is the pressure of the verification gas in the chamber at time $t2_{ver}$, and
   $P1_{ver}$ is the pressure of the verification gas in the chamber at time $t1_{ver}$; and $$P'_{pro} = (P2_{pro} - P1_{pro}) / (t2_{pro} - t1_{pro})$$

where
   $P2_{pro}$ is the pressure of the process gas in the chamber at time $t2_{pro}$, and
   $P1_{pro}$ is the pressure of the process gas in the chamber at time $t1_{pro}$.

7. The processing system of claim 6 wherein the computer means calculates a conditional chamber coefficient for storage in the memory means, in accordance with the relationship:

$$K_c = P'_{ver} / n'_{ver}.$$

8. The processing system of claim 7 wherein the computer means calculates the flow rate of the process gas, in accordance with the relationship:

$$n'_{pro} = P'_{pro} / K_c.$$

9. The processing system of claim 7 wherein the computer means calculates the flow rate of the process gas, in accordance with the relationship:

$$n'_{pro} = (P'_{pro}/P'_{ver})(n'_{ver}).$$

10. The processing system of claim 1, further comprising:
isolation valve means connected between the chamber and the pump means for controlling the evacuation of the chamber.

11. The processing system of claim 10, wherein the flow controller means are mass flow controllers for maintaining a constant flow of gas therethrough.

12. The processing system of claim 11, further comprising:
process gas valve means connected between the process gas flow controller and the chamber for starting and stopping the flow of the process gas; and
verification gas valve means connected between the verification gas flow controller and the chamber for starting and stopping the flow of the verification gas.

13. The processing system of claim 12, wherein:
the process gas source is a plurality of gas sources for providing a plurality of process gases;
the process gas valve means is a plurality of gas valves, one for valve for each of the plurality of process gases; and
the process mass flow controller means is a plurality of controllers, one for controlling each of the plurality of process gases.

14. The processing system of claim 1, wherein the verification gas is a gas selected from the group consisting of nitrogen gas ($N_2$), oxygen gas ($O_2$), nitrous oxide gas ($N_2O$) and argon gas (Ar).

15. The processing system of claim 1, wherein the verification gas is nitrogen gas ($N_2$).

16. The processing system of claim 1, wherein the pressure monitor is a capacitive manometer.

17. A method of determining the flow rate of a process gas entering the reaction chamber of a wafer processing system by comparison with the known flow rate $n'_{ver}$ of a verification gas, comprising the steps of:
providing a flow of verification gas having a known flow rate $n'_{ver}$ into the chamber;
maintaining the known flow rate $n'_{ver}$ at a constant rate into the chamber by a verification gas flow controller;
measuring a first pressure $P1_{ver}$ of the verification gas within the chamber at a first verification time $t1_{ver}$;
measuring a second pressure $P2_{ver}$ of the verification gas within the chamber at a second verification time $t2_{ver}$;
providing a flow of process gas having a flow rate $n'_{pro}$ to be verified into the chamber;
maintaining the known flow rate $n'_{pro}$ at a constant rate into the chamber by a process gas flow controller;
measuring a first pressure $P1_{pro}$ of the process gas within the chamber at a first process time $t1_{pro}$;
measuring a second pressure $P2_{pro}$ of the process gas within the chamber at a second process time $t2_{pro}$;
determining the rate of change $P'_{ver}$ of the verification gas pressure with respect to time $$P'_{ver}=(P2_{ver}-P1_{ver}) / (t2_{ver}-t1_{ver})$$

where
$P2_{ver}$ is the pressure of the verification gas in the chamber at time $t2_{ver}$, and
$P1_{ver}$ is the pressure of the verification gas in the chamber at time $t1_{ver}$;
determining a conditional operating coefficient Kc of the chamber in accordance with the relationship:

$$Kc=P'_{ver} / n'_{ver}$$

determining the rate of change $P'_{pro}$ of the process gas pressure with respect to time $$P'_{pro}=(P2_{pro}-P1_{pro}) / (t2_{pro}-t1_{pro})$$

where
$P2_{pro}$ is the pressure of the process gas in the chamber at time $t2_{pro}$, and
$P1_{pro}$ is the pressure of the process gas in the chamber at time $t1_{pro}$; and
determining the flow rate $n'_{pro}$ of the process gas into the chamber in accordance with the relationship:

$$n'_{pro}=(P'_{pro}/Kc).$$

18. The method of claim 17, comprising the further steps of:
prior to the step of providing a flow of verification gas, evacuating the chamber to a reduced pressure below the verification gas pressure of $P1_{ver}$; and
prior to the step of providing a flow of process gas, evacuating the chamber to a reduced pressure below the process gas pressure of $P1_{pro}$.

19. The method of claim 17 wherein the flow of verification gas is provided by opening a verification flow valve located between the verification flow controller and the chamber, and the flow of process gas is provided by opening a process flow valve located between the process flow controller and the chamber.

20. The method of claim 17 wherein the verification gas flow into the chamber is terminated before the process gas flow is provided.

21. The method of claim 17 further comprising the steps of:
permitting the flow of verification gas into the chamber to stabilize before the first verification time $t1_{ver}$, and
permitting the flow of process gas into the chamber to stabilize before the first process time $t1_{pro}$.

22. The method of claim 21 further comprising the steps of:
maintaining an evacuation flow out of the chamber while the verification gas is stabilizing and terminating the evacuation flow before the first verification time $t1_{ver}$; and
maintaining an evacuation flow out of the chamber while the process gas is stabilizing and terminating the evacuation flow before the first process time $t1_{pro}$.

23. The method of claim 22 wherein the evacuation flow out of the chamber is maintained by a pump means, and the evacuation flow is terminated by closing an isolation valve located between the pump means and the chamber.

24. The method of claim 17 wherein the pressure in the chamber is measured by a pressure monitoring means having a dynamic operating range with generally linear mid-portion.

25. The method of claim 24 wherein the first and second pressure of the process gas in the chamber is measured employing the same generally linear mid-portion of the dynamic operating range of the pressure monitoring means as employed to measure the first and second pressure of the verification gas.

26. The method of claim 17, further comprising the step of:
   maintaining the temperature of the chamber constant during the steps of
   providing the flow of verification gas into the chamber,
   measuring the first and second pressure change of the verification gas,
   providing the flow of process gas into the chamber, and
   measuring the first and second pressure change of the process gas.

27. The method of claim 17, further comprising the step of:
   maintaining the volume of the chamber constant during the steps of
   providing the flow of verification gas into the chamber,
   measuring the first and second pressure change of the verification gas,
   providing the flow of process gas into the chamber, and
   measuring the first and second pressure change of the process gas.

28. The method of claim 17, further comprising the step of:
   maintaining the flow of related gas into chamber constant during the steps of
   providing the flow of verification gas into the chamber,
   measuring the first and second pressure change of the verification gas,
   providing the flow of process gas into the chamber, and
   measuring the first and second pressure change of the process gas.

29. The method of claim 17, wherein before the step of determining the flow rate $n'_{pro}$, comprising the further steps of:
   providing a flow of related gas having a flow rate $n'_{adj}$ into the chamber;
   measuring a first pressure $P1_{adj}$ of the related gas within the chamber at a first adjustment time $t1_{adj}$;
   measuring a second pressure $P2_{adj}$ of the related gas within the chamber at a second adjustment time $t2_{adj}$;
   determining the rate of change $P'_{adj}$ of the related gas pressure with respect to time $$P'_{adj} = (P2_{adj} - P1_{adj}) / (t2_{adj} - t1_{adj})$$

where
   $P2_{adj}$ is the pressure of the related gas in the chamber at time $t2_{adj}$, and
   $P1_{adj}$ is the pressure of the related gas in the chamber at time $t1_{adj}$;
   determining the flow rate $n'_{pro}$ of the process gas into the chamber in accordance with the relationship:

$$n'_{pro} = \frac{(P'_{pro} - P'_{adj})(n'_{ver})}{(P'_{ver} - P'_{adj})}.$$

30. The method of claim 29 wherein the flow rate $n'_{pro}$ of the process gas into the chamber is determined in accordance with the relationship:

$$n'_{pro} = \frac{[P'_{pro} - (P'_{pur} + P'_{lk})](n'_{ver})}{[P'_{ver} - (P'_{pur} + P'_{lk})]}.$$

* * * * *